United States Patent
Ishii et al.

(10) Patent No.: US 11,252,354 B2
(45) Date of Patent: Feb. 15, 2022

(54) IMAGE SENSOR, CONTROL METHOD THEREOF, AND IMAGE CAPTURING APPARATUS

(71) Applicant: CANON KABUSHIKI KAISHA, Tokyo (JP)

(72) Inventors: Mie Ishii, Tokyo (JP); Kazuki Ohshitanai, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/527,690

(22) Filed: Jul. 31, 2019

(65) Prior Publication Data

US 2020/0045258 A1 Feb. 6, 2020

(30) Foreign Application Priority Data

Aug. 1, 2018 (JP) .............................. JP2018-145411

(51) Int. Cl.
| | |
|---|---|
| *H04N 5/361* | (2011.01) |
| *H04N 5/378* | (2011.01) |
| *H04N 5/374* | (2011.01) |
| *H04N 5/369* | (2011.01) |
| *H04N 5/353* | (2011.01) |

(52) U.S. Cl.
CPC ......... *H04N 5/361* (2013.01); *H04N 5/36963* (2018.08); *H04N 5/374* (2013.01); *H04N 5/378* (2013.01); *H04N 5/379* (2018.08); *H04N 5/3532* (2013.01); *H04N 5/3535* (2013.01)

(58) Field of Classification Search
CPC .... H04N 5/341; H04N 5/3532; H04N 5/3535; H04N 5/361; H04N 5/36963; H04N 5/378; H04N 5/379
See application file for complete search history.

(56) References Cited

U.S. PATENT DOCUMENTS

| | | | |
|---|---|---|---|
| 6,380,880 B1* | 4/2002 | Bidermann | H04N 1/195 341/155 |
| 9,781,367 B2 | 10/2017 | Ishii | |
| 2009/0180014 A1* | 7/2009 | Noda | H04N 5/3532 348/308 |
| 2015/0189214 A1* | 7/2015 | Kurose | H01L 25/18 250/208.1 |
| 2019/0104265 A1* | 4/2019 | Totsuka | H04N 5/378 |
| 2019/0141256 A1* | 5/2019 | Kita | H01L 27/14643 |

FOREIGN PATENT DOCUMENTS

| | | |
|---|---|---|
| JP | 2009177207 A | 8/2009 |
| JP | 2014155175 A | 8/2014 |

* cited by examiner

*Primary Examiner* — Daniel M Pasiewicz (74) *Attorney, Agent, or Firm* — Carter, DeLuca & Farrell LLP (57) ABSTRACT

An image sensor comprises: a pixel unit including a plurality of first blocks each of which includes a plurality of first pixels shielded from light and a plurality of second blocks each of which includes a plurality of second pixels that are not shielded from light; and a controller that controls a plurality of readout operations for processing, in parallel, pixel signals read out from the plurality of first blocks and the plurality of second blocks in the pixel unit. The controller performs control so as to end readout of pixel signals from at least a predetermined portion of the first pixels included in each of the plurality of first blocks, before readout of pixel signals from the plurality of second blocks is started.

14 Claims, 10 Drawing Sheets

IMAGE SENSOR, CONTROL METHOD THEREOF, AND IMAGE CAPTURING APPARATUS

BACKGROUND OF THE INVENTION

Field of the Invention

The present invention relates to an image sensor, a control method thereof, and an image capturing apparatus.

Description of the Related Art

In recent years, a CMOS image sensor has been used in many digital single-lens reflex cameras and video cameras. Regarding such a CMOS image sensor, needs for increase in the number of pixels and speed of image capturing have been increasing, and there are demands for high-speed readout techniques of the CMOS image sensor.

As techniques for increasing the speed of the CMOS image sensor, there are known techniques in which a larger number of A/D conversion circuits are used, with an A/D conversion circuit being provided for each pixel or for each block constituted by a relatively small number of pixels, instead of being shared by each pixel array column in a conventional manner.

For example, Japanese Patent Laid-Open No. 2009-177207 proposes a configuration in which pixels and A/D conversion circuits are provided on different substrates, which are attached through Cu—Cu bonding or the like, and are connected to each other. By providing a pixel substrate and an A/D conversion circuit substrate separately, a configuration can be adopted in which one A/D conversion circuit is provided for each of a relatively small number of pixels without impairing the optical property of the pixels, and it is possible to read out the pixels at a drastically high speed.

In addition, as an image sensor having a layered configuration as described above, Japanese Patent Laid-Open No. 2014-155175 describes a configuration in which a pixel substrate on which a plurality of pixel blocks are arranged in matrix, and a processing substrate on which a plurality of processing units that include A/D conversion circuits respectively corresponding to the pixel blocks are arranged in matrix are provided. As an example, the pixel blocks are each made up of 4×4 pixels, namely 16 pixels in total, and the processing units operate in parallel.

Incidentally, image sensors are usually provided with optical black pixels (hereinafter, referred to as "OB pixels") shielded from light so as to not react to light, in order to acquire a signal (black reference signal) that serves as a reference signal for a signal level. In addition, open pixel signals read out from pixels that are not shielded from light (hereinafter, referred to as "open pixels") are subjected to calculation processing using the signal level of OB pixel signals read out from the OB pixels as a reference. Usually, OB pixels of several rows or several columns are provided in a periphery portion including an upper portion (long side portion) and a left portion (short side portion) of the screen. Accordingly, pixel signals can be clamped to a predetermined level, and it is possible to correct a dark current caused by long-time exposure, and a dark signal such as shading in the vertical direction, for example.

In general, it is desirable that OB pixel signals are read out before open pixel signals are read out, and, after that, correction regarding the signal level of a black reference signal obtained from the OB pixel signals is sequentially performed while reading out the open pixel signals. Therefore, in a conventional CMOS image sensor in which an A/D conversion unit is provided for each column, and pixels are sequentially read out from the top of the pixel array, OB pixels are arranged in an upper portion and a left portion of an open pixel area.

However, there has been an issue that a black reference signal has not been acquired when readout of signals of open pixel is started, in a case of a configuration in which processing units are arranged in correspondence with respective pixel blocks as in Japanese Patent Laid-Open No. 2014-155175.

SUMMARY OF THE INVENTION

The present invention has been made in consideration of the above situation, and in an image sensor in which signals can be read out from a plurality of pixel blocks in parallel, readout control is performed so as to sequentially perform processing, using signals of light shielded pixels, on image signals that have been read out.

According to the present invention, provided is an image sensor comprising: a pixel unit including a plurality of first blocks each of which includes a plurality of first pixels shielded from light and a plurality of second blocks each of which includes a plurality of second pixels that are not shielded from light; and a controller that controls a plurality of readout operations for processing, in parallel, pixel signals read out from the plurality of first blocks and the plurality of second blocks in the pixel unit, wherein the controller performs control so as to end readout of pixel signals from at least a predetermined portion of the first pixels included in each of the plurality of first blocks, before readout of pixel signals from the plurality of second blocks is started.

Further, according to the present invention, provided is an image capturing apparatus comprising: an image sensor comprising: a pixel unit including a plurality of first blocks each of which includes a plurality of first pixels shielded from light and a plurality of second blocks each of which includes a plurality of second pixels that are not shielded from light; and a controller that controls a plurality of readout operations for processing, in parallel, pixel signals read out from the plurality of first blocks and the plurality of second blocks in the pixel unit, wherein the controller performs control so as to end readout of pixel signals from at least a predetermined portion of the first pixels included in each of the plurality of first blocks, before readout of pixel signals from the plurality of second blocks is started; and a corrector that corrects a black level based on pixel signals read out from the plurality of first blocks, before readout of pixel signals from the plurality of second block is started.

Furthermore, according to the present invention, provided is an image capturing apparatus comprising: an image sensor comprising: a pixel unit including a plurality of first blocks each of which includes a plurality of first pixels shielded from light and a plurality of second blocks each of which includes a plurality of second pixels that are not shielded from light; and a controller that controls a plurality of readout operations for processing, in parallel, pixel signals read out from the plurality of first blocks and the plurality of second blocks in the pixel unit, wherein the controller performs control so as to end readout of pixel signals from at least a predetermined portion of the first pixels included in each of the plurality of first blocks, before readout of pixel signals from the plurality of second blocks is started, and wherein the controller performs control so as to read out pixel signals from the predetermined portion of the first pixels included in each of the plurality of first blocks before readout of pixel signals from the plurality of second blocks is started, and read out pixel signals from first pixels excluding the predetermined portion of the first pixels in parallel with readout of pixel signals from the plurality of second blocks; and a corrector that corrects variation of pixel signals caused by a change in a drive signal during a readout operation of pixel signals, based on the pixel signals of the first blocks read out in parallel with the pixel signals of the second blocks.

Further, according to the present invention, provided is an image capturing apparatus comprising: an image sensor comprising: a pixel unit including a plurality of first blocks each of which includes a plurality of first pixels shielded from light and a plurality of second blocks each of which includes a plurality of second pixels that are not shielded from light; and a controller that controls a plurality of readout operations for processing, in parallel, pixel signals read out from the plurality of first blocks and the plurality of second blocks in the pixel unit, wherein the controller performs control so as to end readout of pixel signals from at least a predetermined portion of the first pixels included in each of the plurality of first blocks, before readout of pixel signals from the plurality of second blocks is started, wherein the plurality of first blocks are arranged in a long side portion and a short side portion of an area made up of the plurality of second blocks, and wherein the controller performs control so as to read out pixel signals from all of the first pixels included in each of the first blocks arranged in the long side portion, before readout of pixel signals from the plurality of second blocks is started, and read out pixel signals of all of the first pixels included in each of the first blocks arranged in the short side portion, in parallel with readout of pixel signals from the plurality of second blocks; and a corrector that corrects variation of pixel signals caused by a change in a drive signal during a readout operation of pixel signals, based on the pixel signals of the first blocks read out in parallel with the pixel signals of the second blocks.

Further, according to the present invention, provided is an image capturing apparatus comprising: an image sensor comprising: a pixel unit including a plurality of first blocks each of which includes a plurality of first pixels shielded from light and a plurality of second blocks each of which includes a plurality of second pixels that are not shielded from light; and a controller that controls a plurality of readout operations for processing, in parallel, pixel signals read out from the plurality of first blocks and the plurality of second blocks in the pixel unit, wherein the controller performs control so as to end readout of pixel signals from at least a predetermined portion of the first pixels included in each of the plurality of first blocks, before readout of pixel signals from the plurality of second blocks is started, wherein the plurality of first blocks are arranged in a long side portion and a short side portion of an area made up of the plurality of second blocks, and wherein the controller performs control so as to read out pixel signals from all of the first pixels included in each of the first blocks arranged in the long side portion, before readout of pixel signals from the plurality of second blocks is started, and read out pixel signals of all of the first pixels included in each of the first blocks arranged in the short side portion, in parallel with readout of pixel signals from the plurality of second blocks; and a corrector that corrects a black level based on the pixel signals of the first blocks arranged in the long side portion, and corrects variation of pixel signals caused by a change in a drive signal during a readout operation of pixel signals, based on the pixel signals of the first blocks arranged in the short side portion.

Further, according to the present invention, provided is a control method of an image sensor that includes a pixel unit including a plurality of first blocks each of which includes a plurality of first pixels shielded from light and a plurality of second blocks each of which includes a plurality of second pixels that are not shielded from light, and a controller that controls a plurality of readout operations for processing, in parallel, pixel signals read out from the plurality of first blocks and the plurality of second blocks in the pixel unit, the method comprising: performing control so as to end readout of pixel signals from at least a predetermined portion of the first pixels included in each of the plurality of first blocks, before readout of pixel signals from the plurality of second blocks is started.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings. The dimensions, shapes and relative positions of the constituent parts shown in the embodiments should be changed as convenient depending on various conditions and on the structure of the apparatus adapted to the invention, and the invention is not limited to the embodiments described herein.

First Embodiment

Figure 1:
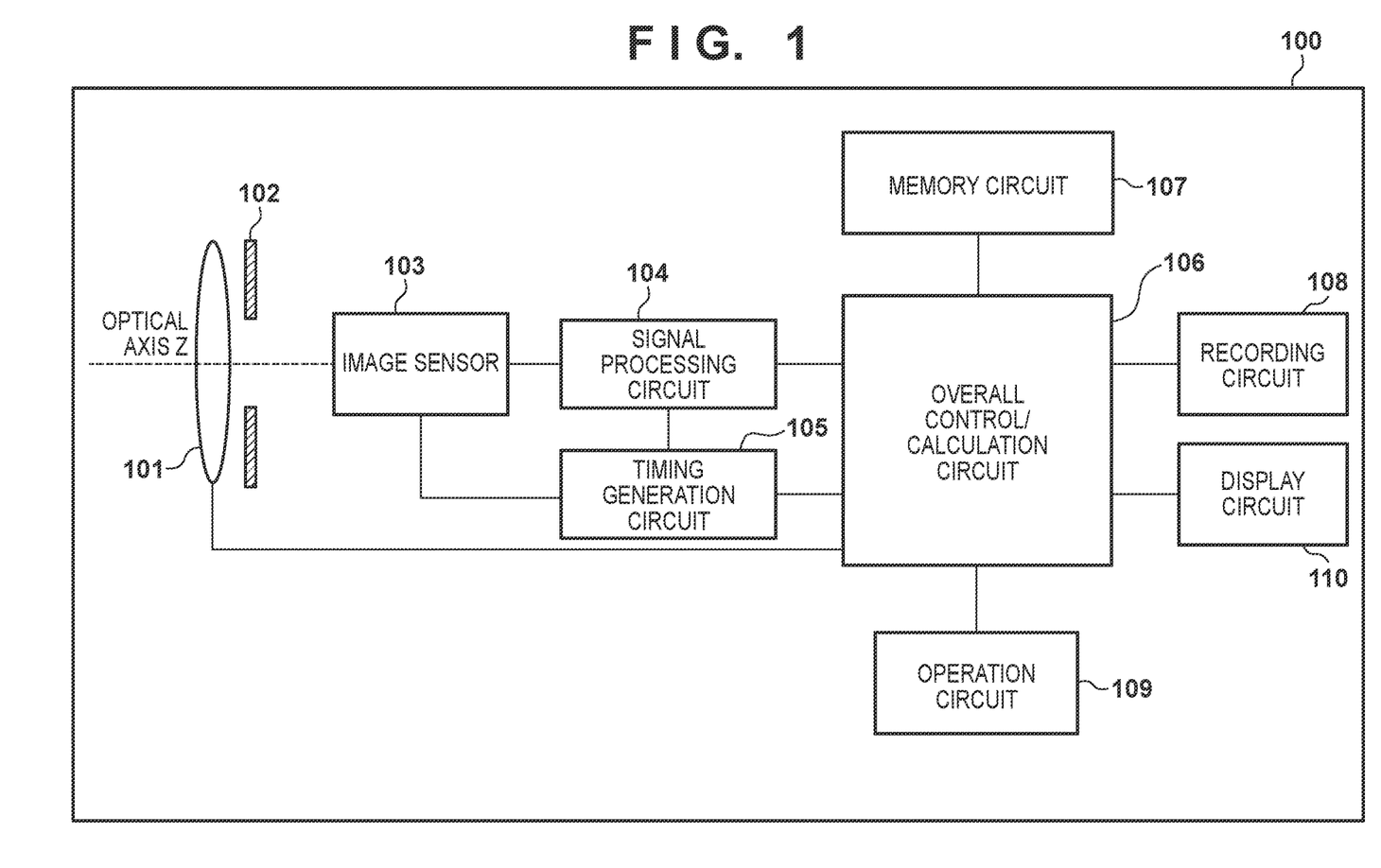
FIG. 1 is a block diagram showing a schematic configuration of an image capturing apparatus according to embodiments of the present invention.

FIG. 1 is a block diagram showing a schematic configuration of an image capturing apparatus 100 of an embodiment of the present invention. In FIG. 1, the image capturing optical system of the image capturing apparatus 100 is provided with an imaging lens 101 and a diaphragm 102. Light that has passed through the imaging lens 101 and the diaphragm 102 forms an image in the vicinity of a focal point of the imaging lens 101. Note that the imaging lens 101 is illustrated as a single lens, but is constituted by a lens group composed of a plurality of lenses in actuality. An image sensor 103 is a CMOS image sensor, and has a function of converting a subject image formed by the imaging lens 101 into electrical signals in accordance with the light amount, and further converting the electrical signals into image signals that can be subjected to data processing. A signal processing circuit 104 performs signal amplification, various types of correction such as reference level adjustment, rearrangement of data, and the like, on image signals output from the image sensor 103. Note that some signal processing functions such as reference level adjustment may be provided in the image sensor 103. A timing generation circuit 105 outputs a driving timing signal to the image sensor 103 and the signal processing circuit 104.

An overall control/calculation circuit 106 performs overall driving and control of the entirety of the image capturing apparatus 100 that includes the image sensor 103, the signal processing circuit 104, and the like. The overall control/calculation circuit 106 also performs predetermined image processing, defect correction, and the like on image signals output from the signal processing circuit 104. A memory circuit 107 and a recording circuit 108 are recording media for recording and holding image signals output from the overall control/calculation circuit 106 and the like, such as a nonvolatile memory or a memory card. An operation circuit 109 receives a signal from an operation member provided in the image capturing apparatus 100, and reflects a user instruction on the overall control/calculation circuit 106. A display circuit 110 displays images that have been shot, live view images, various setting screens, and the like.

Figure 2:
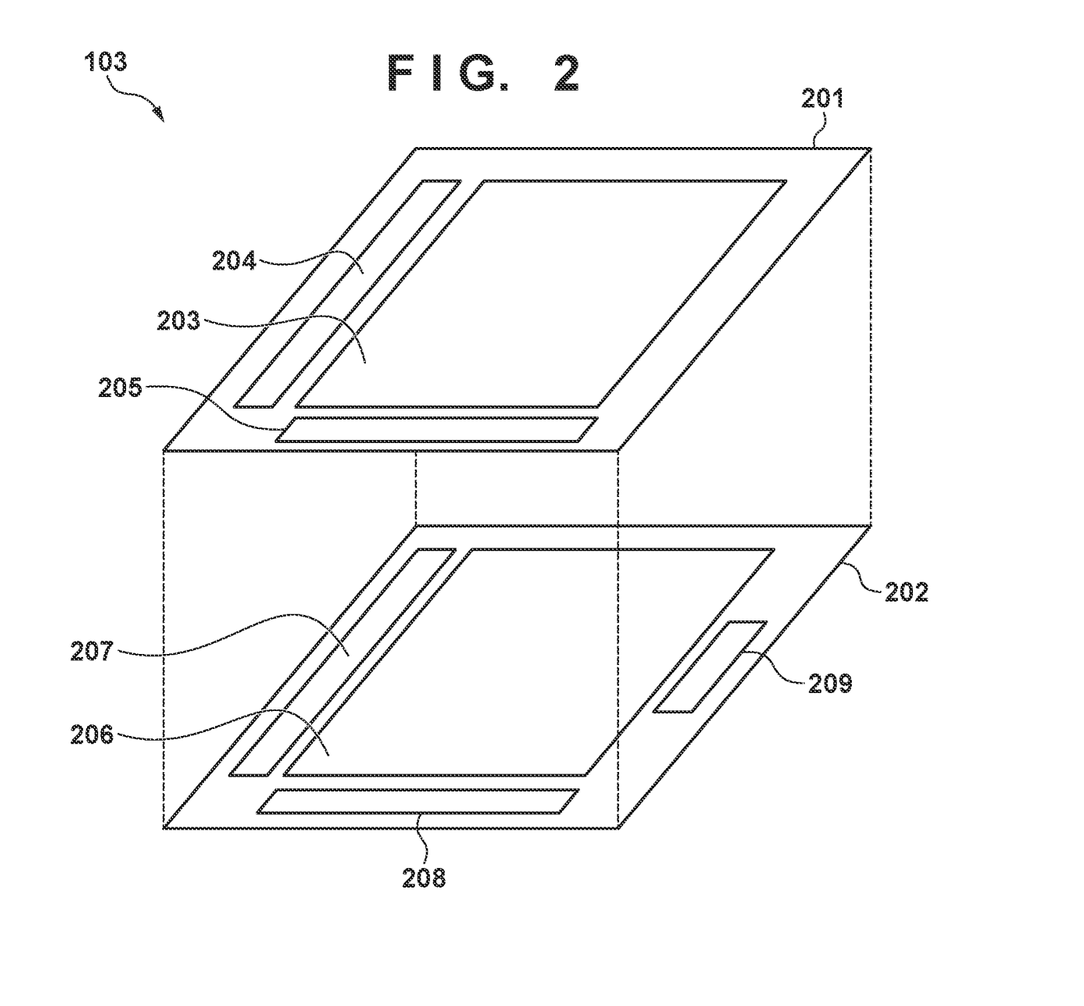
FIG. 2 is a schematic diagram showing a configuration example of an image sensor according to the embodiments of the present invention.
Figure 3:
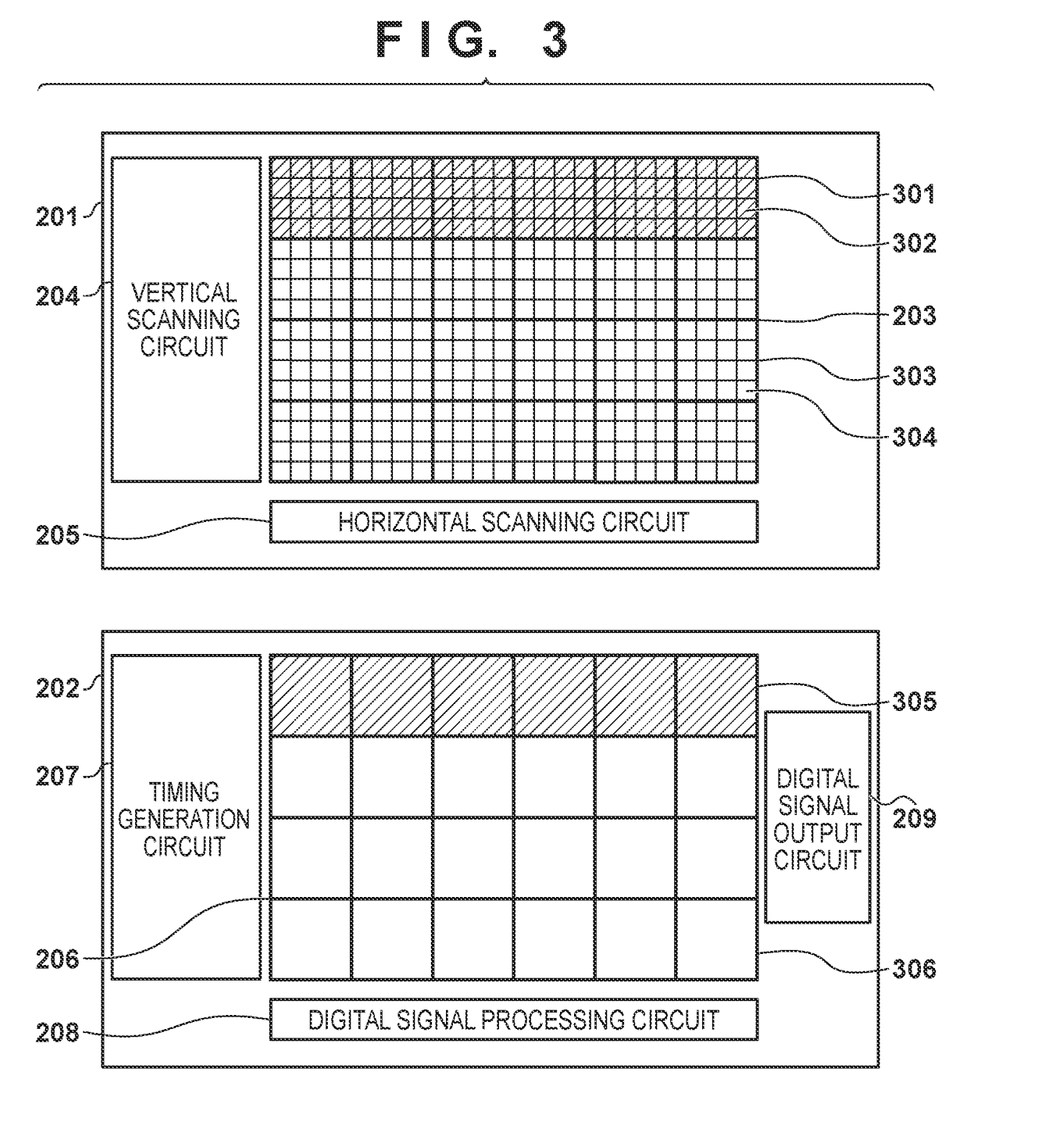
FIG. 3 is a plan view showing a configuration example of the image sensor according to the embodiments of the present invention.

Next, the configuration of the image sensor 103 will be described with reference to FIGS. 2 to 4C. FIGS. 2 and 3 are diagrams showing a configuration example of the image sensor 103 in an embodiment of the present invention. In FIG. 2, the image sensor 103 has a configuration in which a pixel area substrate 201 and a readout circuit substrate 202 are layered. Wirings of the substrates are electrically connected using silicon through electrodes and the like. The pixel area substrate 201 is provided with a pixel area 203, and a vertical scanning circuit 204 and a horizontal scanning circuit 205 that drive and scan pixels. The readout circuit substrate 202 is provided with a readout area 206 composed of a plurality of readout circuits, a timing generation circuit (TG) 207, a digital signal processing circuit 208, and a digital signal output circuit 209.

Next, blocks constituting the image sensor 103 having the above configuration will be described in detail with reference to FIG. 3. The pixel area 203 on the pixel area substrate 201 is made up of an optical black (OB) area (an area indicated by hatching) optically shielded from light, and an open area that receives light of a subject image. Here, a configuration is adopted in which the OB area having several rows is arranged in an upper portion (long side portion) of the open area. In the OB area, pixels 302 shielded from light (hereinafter, referred to as "OB pixels 302") are arranged in matrix, and in the open area, pixels 304 that are not shielded from light (hereinafter, referred to as "light-receiving pixels 304"), are arranged in matrix. Pixel signals read out from the OB pixels 302 arranged in the OB area are used for acquiring a correction value for clamp processing to a reference signal level.

Here, each pixel block that is surrounded by a thick frame in FIG. 3, and in which 4×4 OB pixels 302, namely 16 OB pixels 302 in total are arranged is referred to as an OB pixel block 301. Similarly, each pixel block in which 4×4 light-receiving pixels 304, namely 16 light-receiving pixels 304 in total are arranged is referred to as an open pixel block 303. Note that, as shown in FIG. 3, each pixel block does not lie across the boundary between the OB area and the open area, and the pixel blocks are arranged to be divided between the OB area and the open area. In other words, the OB area includes the OB pixel blocks 301 only, and the open area includes the open pixel blocks 303 only.

On the other hand, on the readout circuit substrate 202, readout circuits 305 and 306 are arranged in matrix. The readout circuits 305 and 306 are respectively connected to the pixel blocks (the OB pixel blocks 301 and the open pixel blocks 303) arranged at corresponding positions, and can process, in parallel, pixel signals output in parallel from the corresponding pixel blocks. Note that the readout circuits 305 and 306 have the same configuration, but, for convenience of explanation, readout circuits connected to the OB pixel blocks 301 are referred to as "OB pixel readout circuits 305", and readout circuits connected to the open pixel blocks 303 are referred to as "open pixel readout circuits 306".

The positional relation between the pixel blocks and the readout circuits corresponding thereto will be described briefly. For example, the top-left OB pixel block 301 on the pixel area substrate 201 from among 6×4 pixel blocks in FIG. 3 is connected to the top left OB pixel readout circuit 305 on the readout circuit substrate 202. Similarly, the other blocks are connected to corresponding pixel readout circuits. With the pixel blocks being connected to the pixel readout circuits in this manner, it is possible to shorten output lines extending from the pixel unit, and the image sensor 103 can be configured without increasing the wiring resistance of the output lines.

The TG 207 sends signals to the vertical scanning circuit 204, the horizontal scanning circuit 205, the OB pixel readout circuits 305, the open pixel readout circuits 306, the digital signal processing circuit 208, and the digital signal output circuit 209, and controls driving of these circuits.

The vertical scanning circuit 204 and the horizontal scanning circuit 205 send drive signals to the pixels of the pixel area 203, and control driving such as reset, accumulation, and transfer of the charges in the pixels, and output of the charges in the pixels to the readout circuits. The OB pixel readout circuits 305 and the open pixel readout circuits 306 respectively receive output signals of the pixels (the OB pixels 302 and the light-receiving pixels 304) of the corresponding pixel blocks in accordance with control of the TG 207, and perform analog/digital conversion (A/D conversion). The signals are then sequentially output from the digital signal output circuit 209 to the outside of the image sensor 103 via the digital signal processing circuit 208.

Note that, for ease of description, FIG. 3 shows a configuration in which the OB pixel blocks 301 and the open pixel blocks 303 are each made up of 4×4=16 pixels, but the present invention is not limited thereto. In addition, the number of readout circuits and the number of pixel blocks are each described as 6×4=24, but an actual image sensor 103 is constituted by several thousand to several tens of thousands of pixel blocks and readout circuits.

Figure 4A:
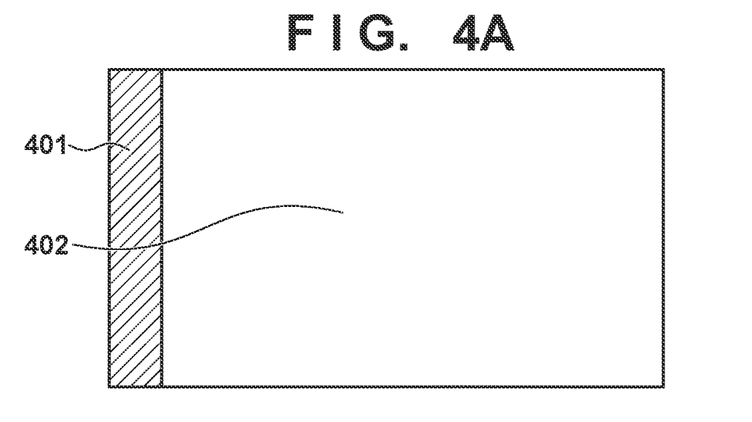
FIGS. 4A to 4C are diagrams showing a configuration example of a pixel area of an image sensor according to the embodiments of the present invention.
Figure 4B:
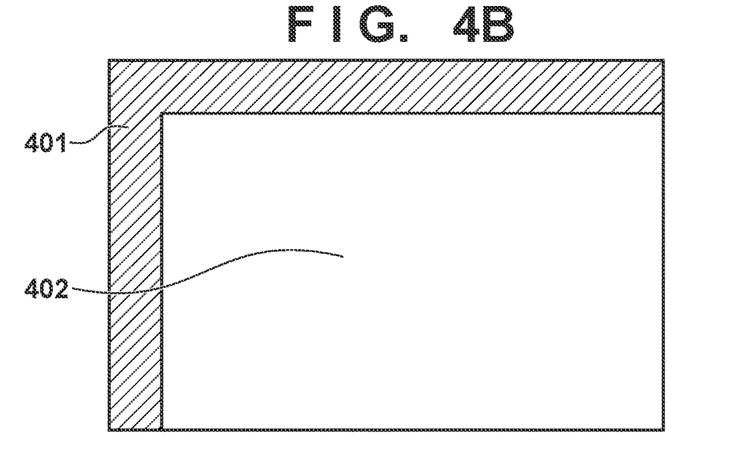
Figure 4C:
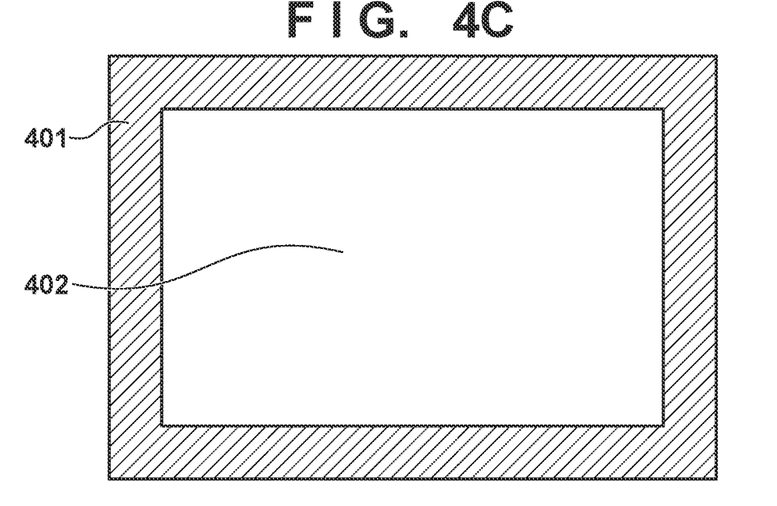

In addition, the arrangement of the OB area and the open area in the pixel area 203 is also not limited to the configuration in FIG. 3. FIGS. 4A to 4C are diagrams showing another arrangement example of the OB area and the open area in the pixel area 203. FIG. 4A shows a configuration in which an OB area 401 having several columns is arranged in a left portion (short side portion) of an open area 402. In addition, a configuration may also be adopted in which the OB area 401 having several rows and several columns is arranged in an upper portion (long side portion) and a left portion (short side portion) as shown in FIG. 4B, or a configuration may also be adopted in which the OB area 401 having several rows and several columns is arranged so as to surround the pixel area (a periphery portion) as shown in FIG. 4C. Arrangements other than these may also be adopted.

Figure 5:
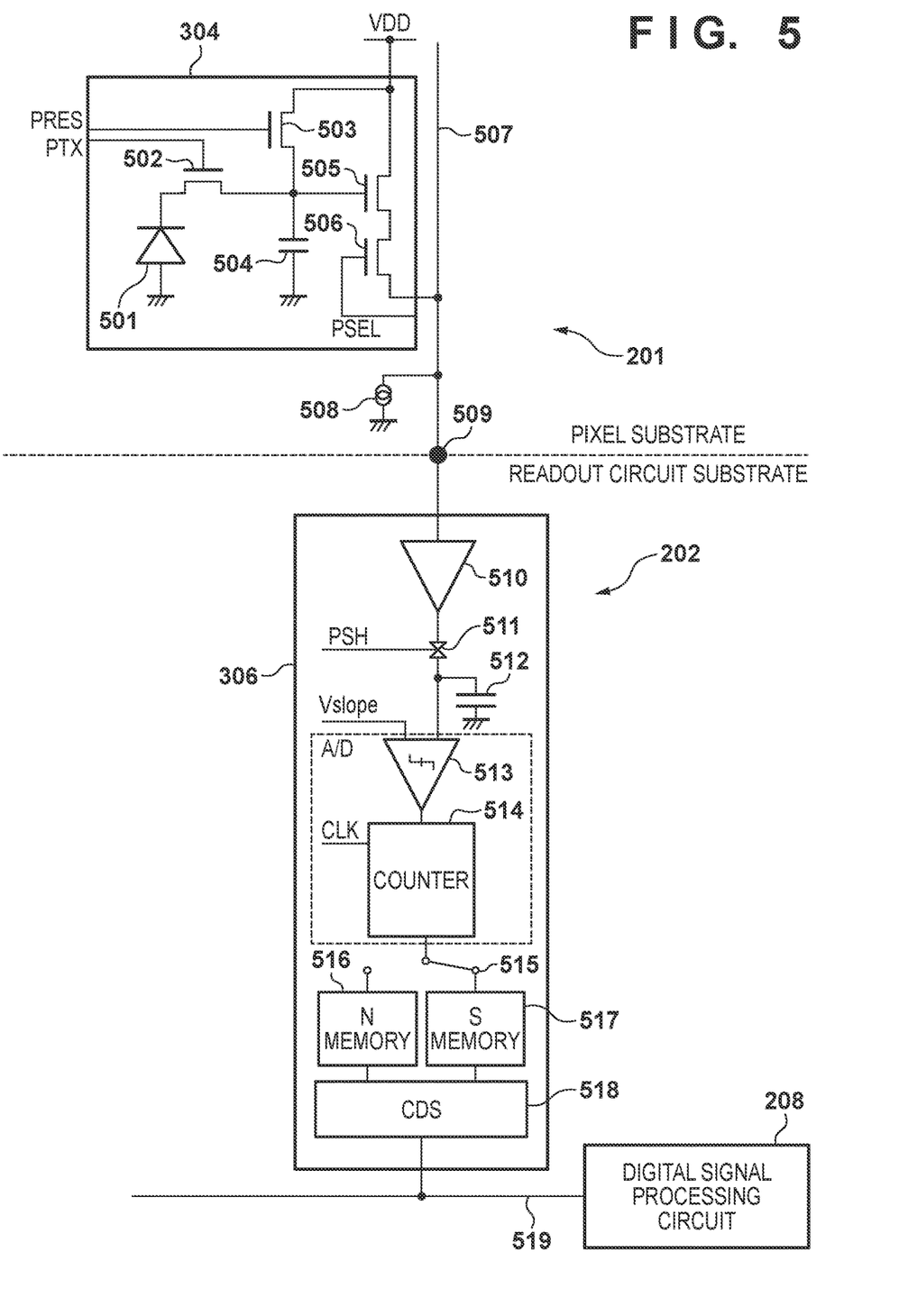
FIG. 5 is a diagram showing the configurations of a pixel and a readout circuit of an image sensor according to the embodiments of the present invention.

FIG. 5 is a diagram showing a configuration of a light-receiving pixel 304 and an open pixel readout circuit 306 of the image sensor 103. For simplification of illustration, FIG. 5 shows only one pixel and only one readout circuit, but the OB pixels 302 and the OB pixel readout circuits 305 have a similar configuration. The light-receiving pixels 304 formed on the pixel area substrate 201 are connected to the open pixel readout circuits 306 formed on the readout circuit substrate 202 via a silicon through electrode 509.

In the light-receiving pixel 304, a photodiode (PD) 501 (a photoelectric conversion portion) generates charges for a subject image formed by the imaging lens 101, and the generated charges are accumulated. The charges accumulated in the PD 501 are transferred to a floating diffusion portion (FD) 504, which is a charge holding portion, via a transfer MOS transistor (transfer switch) 502. When a selection switch 506 is switched on, the charges transferred to the FD 504 are output as a voltage corresponding to the charges, to an output line 507 via an amplification MOS transistor (SF) 505 that forms a source follower amplifier. A current source 508 is connected to the output line 507.

Note that the selection switch 506 is controlled in units of pixel blocks under control of the vertical scanning circuit 204 and the horizontal scanning circuit 205, and pixel signals of pixels selected from the pixel blocks are output to the output lines 507 at the same time. A reset MOS transistor (reset switch) 503 resets the potential of the FD 504 to VDD, and resets the potential of the PD 501 to VDD via the transfer switch 502. The transfer switch 502, the reset switch 503, and the selection switch 506 are respectively controlled by control signals PTX, PRES, and PSEL, via signal lines (not illustrated) connected to the vertical scanning circuit 204. The signal lines extending from the vertical scanning circuit 204 enable control in units of rows, and, furthermore, it is possible to control driving of given pixels within pixel blocks, by performing control with signal lines for the horizontal scanning circuit 205 controlling on/off being connected.

Next, the circuit configuration of an open pixel readout circuit 306 will be described. An amplifier 510 amplifies a signal emerged on the output line 507, and a capacitor 512 is used for holding a signal voltage. Writing to the capacitor 512 is controlled by a switch 511 that is switched on/off by a control signal PSH. A reference voltage Vslope supplied from a slope voltage generation circuit (not illustrated) is input to one input of a comparator 513, and output of the amplifier 510 written to the capacitor 512 is input to the other input. The comparator 513 compares output of the amplifier 510 with the reference voltage Vslope, and outputs one of binary values of a low level and a high level based on the magnitude relationship. Specifically, if the reference voltage Vslope is smaller than the output of the amplifier 510, a signal at a low level is output, and if the reference voltage Vslope is larger than the output of the amplifier 510, a signal at a high level is output. When the level of the reference voltage Vslope starts changing, CLK is activated at the same time, and when output of the comparator 513 is at the high level, a counter 514 counts up in correspondence with CLK, and when output of the comparator 513 changes to the low level, stops counting at the same time.

A digital signal acquired by A/D converting a signal at a reset level of the FD 504 (hereinafter, referred to as "N signal") is held in an N memory 516. In addition, a signal in which a signal of the PD 501 is superimposed on the N signal of the FD 504 (hereinafter, referred to as "S+N signal") is A/D converted into a digital signal, and the digital signal is held in an S memory 517. Whether to write the signal to the N memory 516 or the S memory 517 is determined by a switch 515.

As described above, a CDS circuit 518 subtracts the N signal held in the N memory 516 from the S+N signal held in the S memory 517, and acquires an S signal (optical signal) from which reset noise components have been removed. The S signal is output to the digital signal processing circuit 208 via a digital signal output line 519, under control of the TG 207. Then, after calculation processing such as clamping has been performed, the S signal is output to the outside of the image sensor 103 via the digital signal output circuit 209.

Figure 6:
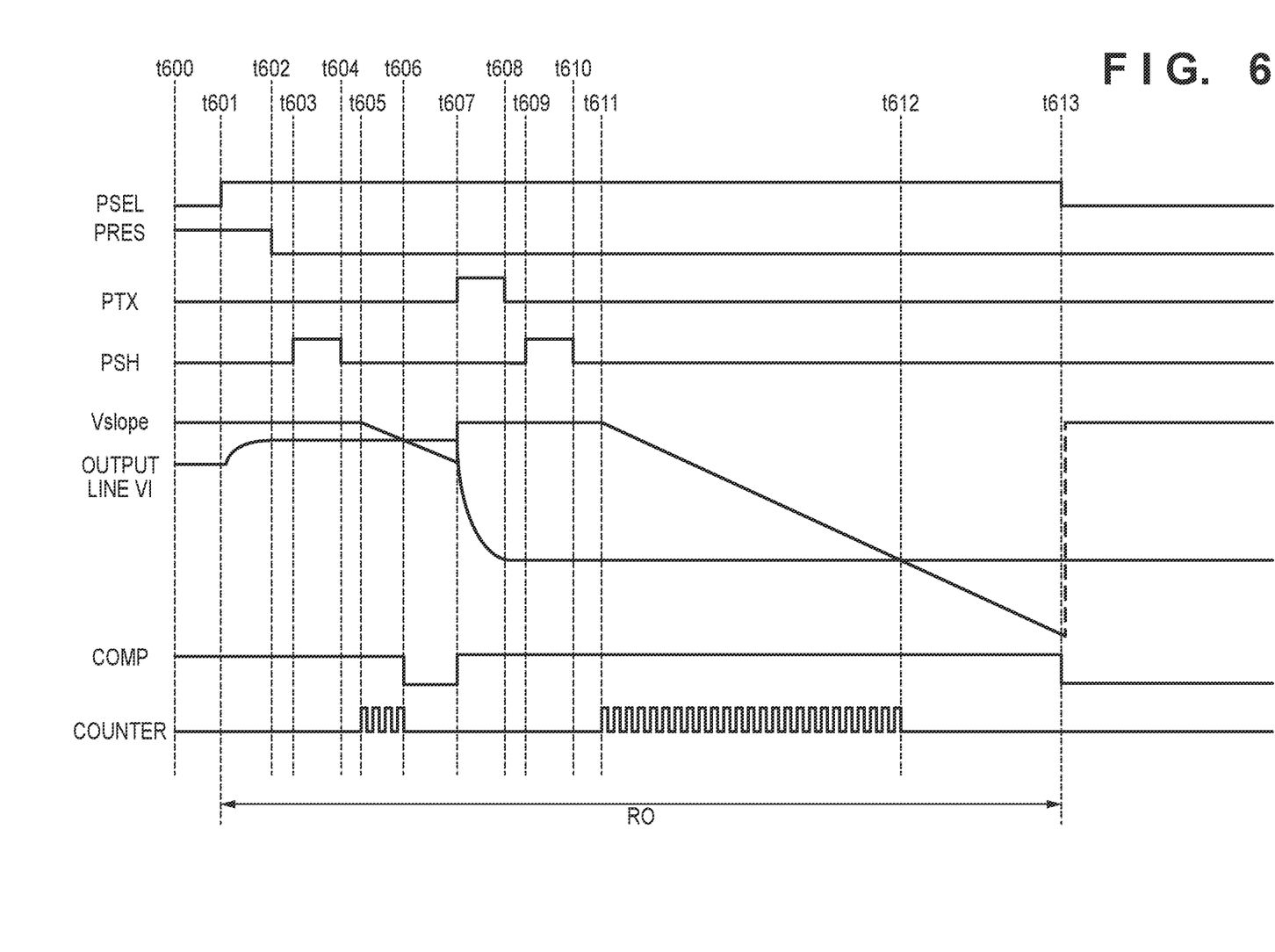
FIG. 6 is a timing chart showing an example of a readout operation of pixel signals of pixels according to the embodiments of the present invention.

FIG. 6 is a timing chart showing an example of a readout operation of pixel signals from the pixels (the OB pixels 302 and the light-receiving pixels 304) of the image sensor 103 that has the circuit configuration shown in FIG. 5. FIG. 6 shows timings of drive pulses, the reference voltage Vslope, and the counter. A potential V1 output from the amplifier 510 at each timing is also shown. COMP indicates an output level of the comparator 513.

Before a signal from the PD 501 is read out, a control signal PRES of the reset switch 503 changes to Hi (t600). Accordingly, the gate of the SF 505 is reset to a reset power supply voltage. A control signal PSEL is changed to Hi at a time t601, and the SF 505 enters an operating state. Reset of the FD 504 is then released by changing the control signal PRES to Lo at a time t602. The potential of the FD 504 at this time is read out as a reset signal level (N signal) to the output line 507, and is input to readout circuits (the OB pixel readout circuit 305 and the open pixel readout circuit 306). By switching the switch 511 on and off by the control signal PSH being changed to Hi and Lo at times t603 and t604, the N signal read out to the output line 507 is amplified by the amplifier 510 with a predetermined gain, and is then held in the capacitor 512. The potential of the N signal held in the capacitor 512 is input to one terminal of the comparator 513.

After the switch 511 was switched off at the time t604, the slope voltage generation circuit (not illustrated) decreases the reference voltage Vslope from the initial value over the elapse of time from a time t605 to a time t607. When the level of the reference voltage Vslope starts to change at the time t605, CLKs are supplied to the counter 514, and the value of the counter 514 increases in accordance with the number of CLKs. Subsequently, when the reference voltage Vslope input to the comparator 513 reaches a level same as the level of the N signal, an output COMP of the comparator 513 changes to the low level (at a time t606), and the operation of the counter 514 also stops at the same time. The count value when the operation of the counter 514 stops at this time is a value resulting from A/D converting the N signal, and is held in the N memory 516.

Next, photocharges accumulated in the PD 501 are transferred to the FD 504 with the control signal PTX being sequentially changed to Hi and Lo at times t607 and t608 after the digitalized N signal has been held in the N memory 516. A change in the potential in the FD 504 that is in accordance with the charge amount is then read out as an S+N signal (optical components+reset noise components) to the output line 507, and is input to the readout circuit (the OB pixel readout circuit 305 or the open pixel readout circuit 306). After being amplified by the amplifier 510 with a predetermined gain, the S+N signal is held in the capacitor 512 by the switch 511 being switched on/off with the control signal PSH being sequentially changed to Hi and Lo at times t609 and t610. The potential held in the capacitor 512 is input to one terminal of the comparator 513.

After the switch 511 is switched off at the time t610, the slope voltage generation circuit (not illustrated) decreases the reference voltage Vslope from the initial value along over the elapse of time from a time t611 to a time t613. When the level of the reference voltage Vslope starts changing at the time t611, CLKs are supplied to the counter 514 at the same time, and the value of the counter 514 increases in accordance with the number of CLKs. Subsequently, when the reference voltage Vslope that has been input to the comparator 513 reaches a level same as the level of the S+N signal, the output COMP of the comparator 513 changes to the low level (at a time t612), and the operation of the counter 514 also stops at the same time. This count value when the operation of the counter 514 stops at this time is a value resulting from A/D converting the S+N signal, and is held in the S memory 517.

A period of time RO from the time t601 to a time t613 that have been described above is a period of time during which pixel signals of pixels (the OB pixels 302 and the light-receiving pixels 304) are read out. By this readout driving being repeated for the number of pixels that make up each of the pixel blocks (the OB pixel blocks 301 and the open pixel blocks 303), readout for one frame is complete.

However, when the above-described readout operation is performed on all of the pixel blocks at the same time, a black reference signal cannot be acquired during first pixel readout of the open pixel blocks 303, and thus the digital signal processing circuit 208 cannot perform clamp processing.

Figure 7:
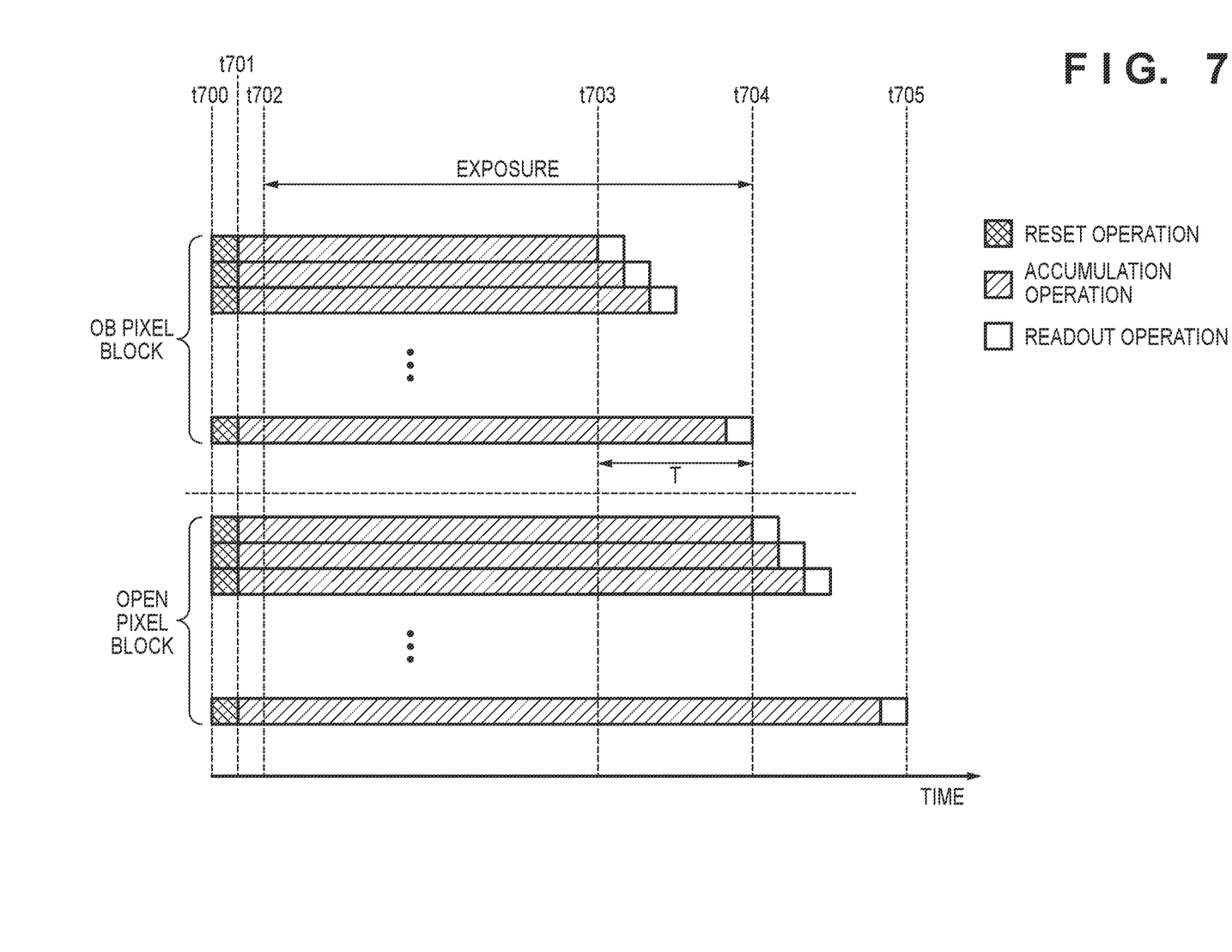
FIG. 7 is a diagram showing readout control of the image sensor according to a first embodiment.

In view of this, charge accumulation and readout driving of pixel signals according to the first embodiment of the present invention will be described with reference to FIG. 7. FIG. 7 is a diagram schematically showing an exemplary operation of all of the OB pixel blocks 301 and the open pixel blocks 303 that make up the pixel area, where the horizontal axis indicates time. In the first embodiment, the timing of a readout operation of pixel signals is made different between the OB pixel blocks 301 and the open pixel blocks 303.

As shooting starts, a reset operation of all of the pixels is performed at a time t700. Here, the vertical scanning circuit 204 performs a batch reset operation by switching the control signals PRES and PTX on for all of the rows. By switching the control signals PRES and PTX off for all the rows after the batch reset, an accumulation operation of all of the pixels is started at the same time at a time t701. Exposure then starts by a shutter (not illustrated) being opened at a time t702. Here, a period of time until a time t704 when the shutter is closed is an exposure period of the open area, the accumulation operation ends here, and, after that, readout of pixel signals from the open pixel blocks 303 is started. On the other hand, before the accumulation operation of the open pixel blocks 303 ends at the time t704, a readout operation of pixel signals of the OB pixel blocks 301 is started at a time t703.

Pixel readout driving can be carried out by following the timing chart shown in FIG. 6, and, when readout of one pixel ends, the next pixel is read out sequentially, thereby sequentially reading out pixel signals of the OB pixels 302 that make up the OB pixel blocks 301.

Here, the time t703 is set to be earlier than the time t704 by a period of time T corresponding to (the period of time (RO) required for reading out one pixel signal of an OB pixel 302)×(the number of pixels (16 pixels in the examples in FIGS. 4A to 4C) that make up an OB pixel block 301). By performing control in this way, it is possible to end readout of the pixel signals of the OB pixel blocks before readout of pixel signals of the open pixel blocks 303 is started. Subsequently, by the digital signal processing circuit 208 calculating a black reference signal based on the pixel signals of the OB pixel blocks 301 that have been read out in advance, clamp processing can be performed during readout of pixel signals of the open pixel blocks 303. Note that clamp processing will be described later.

Note that, usually, power-saving driving in which driving switches of readout circuits are switched off during an accumulation period so as to decrease the power, and the readout circuits is driven when a readout operation is started is performed. In this embodiment, the driving switches of the OB pixel readout circuits 305 and the open pixel readout circuits 306 are controlled separately, and the OB pixel readout circuits 305 are recovered from power-saving driving first.

Figure 8:
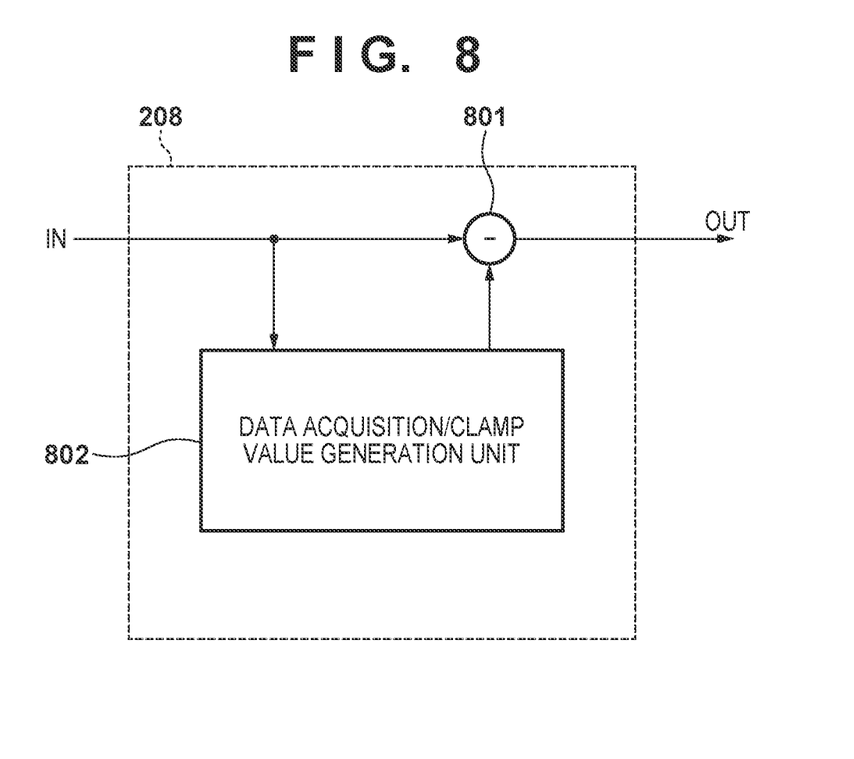
FIG. 8 is a diagram illustrating clamp processing in a signal processing circuit according to the first embodiment.

Subsequently, clamp processing in the digital signal processing circuit 208 will be described with reference to FIG. 8. Pixel signals sent from the OB pixel readout circuits 305 and the open pixel readout circuits 306 are input from IN in FIG. 8. If pixel signals of the OB pixel blocks 301 are input based on a control signal from the TG 207, the pixel signals are sent to a data acquisition/clamp value generation unit 802. The data acquisition/clamp value generation unit 802 performs averaging processing of pixel signals from the OB area, and calculates a black reference signal. For example, averaging processing of pixel signals of all of the OB pixel blocks 301 is performed, a black reference signal is calculated, and a clamp value is calculated based on the black reference signal.

Subsequently, when the pixel signals of the open pixel blocks 303 are read out and input to the digital signal processing circuit 208, a subtraction circuit 801 performs subtraction processing of the clamp value. Accordingly, it is possible to eliminate deviation of a black level due to the influence of a dark current and the like, and match the black level of the pixel signals to the black reference signal.

As described above, according to the first embodiment, clamp processing can be performed appropriately by reading out pixel signals of the OB area before reading out pixel signals of the open area. Note that, in this first embodiment, clamp processing is performed by the digital signal processing circuit 208 of the image sensor 103, but may also be performed by the signal processing circuit 104 of the image capturing apparatus.

Moreover, in the example shown in FIG. 3, the number of OB pixels 302 that make up an OB pixel block 301 and the number of light-receiving pixels 304 that make up an open pixel block 303 are the same, but do not necessarily need to be the same. For example, if the number of pixels 302 that make up an OB pixel block 301 is smaller than the number of light-receiving pixels 304 that make up an open pixel block 303, it is possible to read out pixel signals of the open area with a shorter time lag. In this case, the number of pixels 302 that make up an OB pixel block 301 may be simply reduced to 2×4 pixels, for example, without changing the size of the pixels, or the number of pixels may also be reduced by increasing the size of pixels. Also, those two methods may be combined.

Variation of First Embodiment

Figure 9:
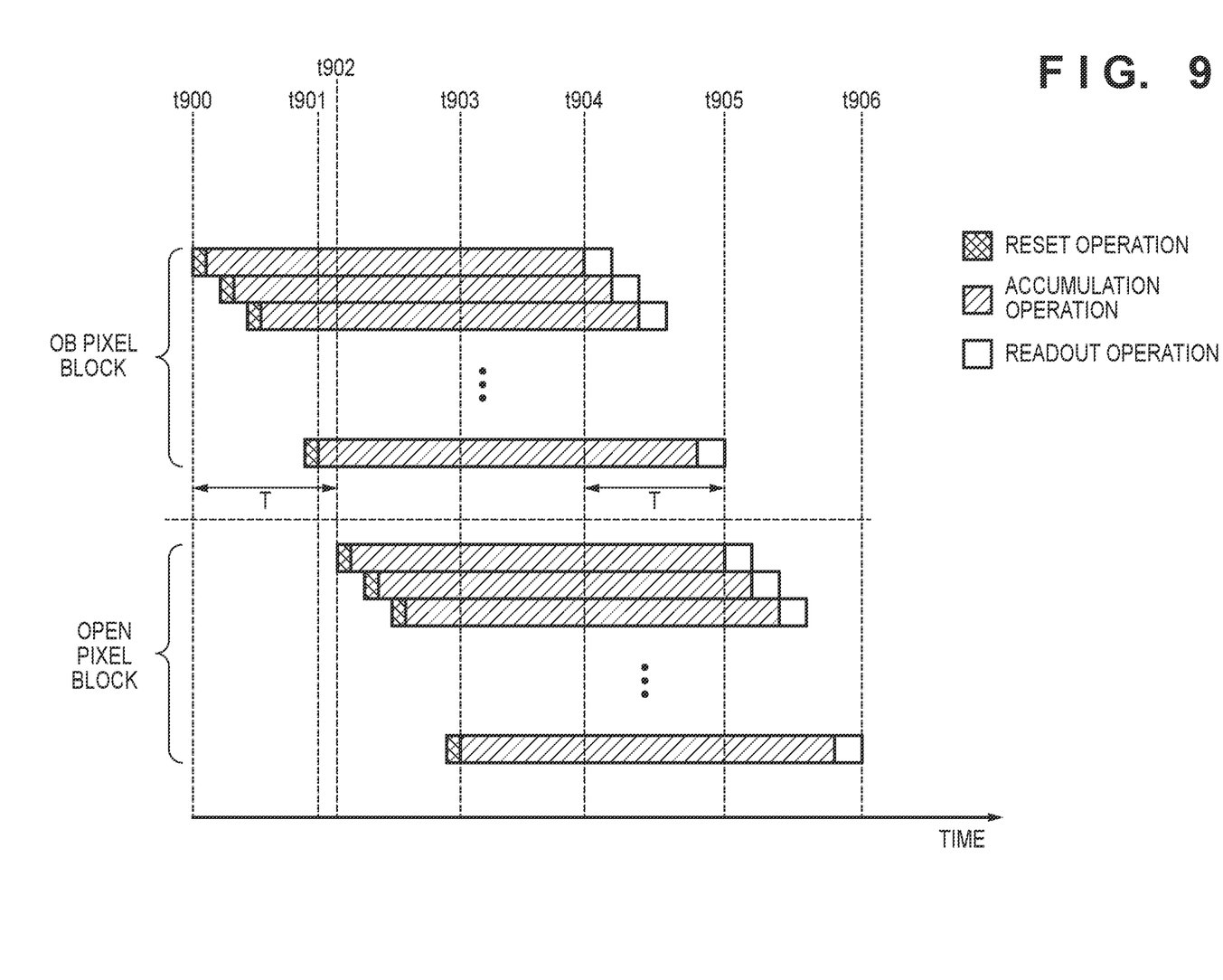
FIG. 9 is a diagram showing other readout control of the image sensor according to a variation of the first embodiment.

FIG. 9 is a diagram schematically showing another exemplary operation of the image sensor 103. In the case of the operation shown in FIG. 7, there arises a slight difference between an accumulation period of the OB pixels 302 of the OB pixel blocks 301 and an accumulation period of the light-receiving pixels 304 of the open pixel blocks 303. In shooting in a state where there is a large amount of dark current such as shooting at a high temperature, there is a possibility that a difference in the dark current amount is caused, and a black reference signal cannot be acquired properly. In addition, batch reset of all of the pixels has been performed, and thus there is a slight difference in the accumulation period between pixels within the same pixel block. In still image shooting in which a shutter is used, a difference in the accumulation period can be suppressed slightly by blocking light using the shutter. In contrast, in moving image shooting in which a shutter is not used and the like, so-called rolling driving is usually performed in which the timing of a reset operation is shifted so as to eliminate the differences in exposure period and accumulation period.

In view of this, in the operation shown in FIG. 9, while rolling driving is performed, the OB pixel blocks 301 are reset earlier by the period of time T required for reading out the pixel signals of an OB pixel block 301. Specifically, the vertical scanning circuit 204 performs a reset operation at a time t900 to a time t901 by sending the control signals PRES and PTX only to the OB pixels 302 of the OB pixel blocks 301. Furthermore, a time for starting the reset operation is shifted in consideration of a time for starting readout of the pixels. After the reset operation, an accumulation operation of the OB pixels 302 of the OB pixel blocks 301 is started in order. Subsequently, after the period of time T has elapsed since the time t900, a reset operation of the light-receiving pixels 304 of the open pixel blocks 303 is performed at a time t902 to a time 903, and an accumulation operation of the light-receiving pixels 304 is started. After that, similarly to the description given with reference to FIG. 7, after a predetermined accumulation period has elapsed, the pixel signals of the OB pixel blocks 301 are read out since a time t904, and readout of the pixel signals of the open pixel blocks 303 is started at a time t905.

As described above, by starting reset and accumulation operations earlier by a time required for reading out the pixel signals of the OB area, it is possible to eliminate the difference in accumulation period between the OB area and the open area.

Second Embodiment

Next, a second embodiment of the present invention will be described. In the second embodiment, a method for correcting a deviation of a black level caused by the influence of a change in the power supply and GND, and the like during a readout operation of pixel signals, using OB pixel signals will be described. In general, various types of reference power supplies and GND are supplied to the image sensor in common, and if such power supplies and GND change during a readout operation of pixel signals, signals of the pixels that are being read out at this time have substantially a uniform level difference. If this level difference is not corrected, pattern noise is caused, and the image quality of an output image deteriorates.

Figure 10:
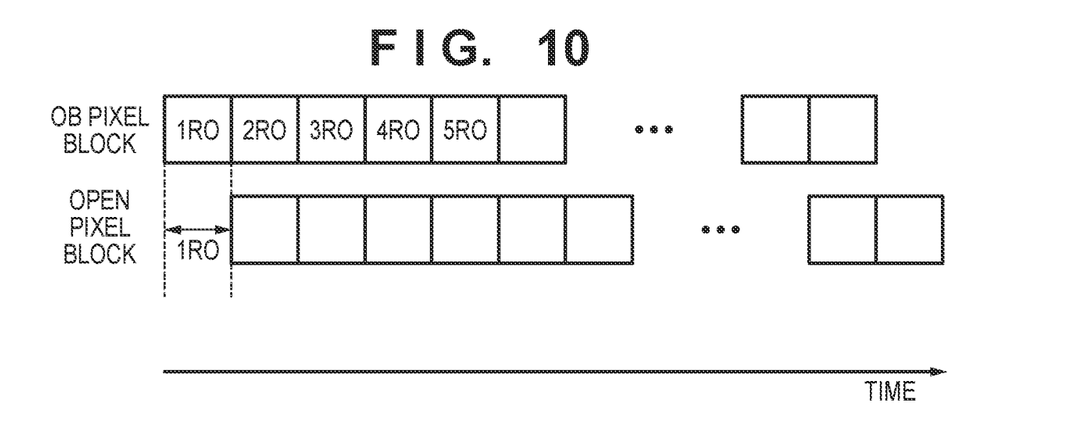
FIG. 10 is a diagram showing readout control of the image sensor according to a second embodiment.

FIG. 10 is a diagram schematically showing an exemplary operation of readout driving of pixel signals according to the second embodiment. In the second embodiment, readout of pixel signals of the OB pixel blocks 301 is started first, and, during readout of pixel signals of the open pixel blocks 303 as well, pixel signals of the OB pixel blocks 301 are read out. One rectangle in FIG. 10 corresponds to the time (RO) for reading out one pixel shown in FIG. 6, and a readout operation of pixels in pixel blocks is indicated.

In this second embodiment, as shown in FIG. 10, for example, pixel signals of the OB pixel blocks 301 are read out earlier by a period of time for reading out one pixel. The digital signal processing circuit 208 then clamps mainly dark current components using the pixel signals of the OB pixel blocks that have been read out earlier. Hereinafter, the clamp processing is referred to as "dark current correction". More specifically, an OB pixel 302 is read out from each of the plurality of OB pixel blocks 301, and calculation is performed on a plurality of acquired pixel signals, and the resulting value is used as a correction value of dark current correction.

On the other hand, pixel signals of the OB pixel blocks 301 read out at the same timing as pixel signals of the open pixel blocks 303 are used for clamping these pixel signals of the open pixel blocks 303. This processing is for correcting a change in the power supply and GND during a readout operation of pixel signals, and is hereinafter referred to as "correction of change-in-level during readout". Note that, when the pixel signals read out at the same timing are transmitted to the digital signal processing circuit 208, the pixel signals of the OB pixel blocks 301 are prioritized. Also, similarly to dark current correction, based on the pixel signals of the plurality of OB pixels 302 that have been respectively read out from the plurality of OB pixel blocks 301, a correction value for the correction of change-in-level during readout is calculated and used.

Note that the number of pixels of the OB pixel blocks 301 that are read out for dark current correction before scanning the open area 402 does not need to be limited to one pixel per pixel block, and may be larger. The larger the number of pixels that are used for clamp value calculation of dark current correction is, more accurately a correction value can be calculated. In this case, the number of pixels that make up an OB pixel block 301 is favorably increased by the number of pixels that are used for calculation of a correction value for dark current correction. For example, in FIG. 3, an OB pixel blocks 301 is made up of 16 pixels, which is the same as the number of pixels of an open pixel block 303, but a configuration may also be adopted in which the number of pixels is set to vertically five rows and horizontally four columns, namely 20 pixels, and pixel signals of four pixels are read out from the OB pixel block 301 before scanning the open area 402.

A clamp value used for the correction of change-in-level during readout is calculated based on the result of calculating an average value of pixel signals of the plurality of OB pixel blocks 301 read out at the same timing, and pixel signals of the open area are corrected. Note that, at this time, it is favorable that the OB area is set large, but the area of the image sensor 103 would increase as a result, and thus the OB area cannot be very large, and it is usually difficult to set the number of OB pixels 302 for obtaining pixel signals for the correction of change-in-level during readout to be very large. In that case, there is a possibility that, if noise during readout is large, an error of a correction value is large. In view of this, for example, a configuration may also be adopted in which a change level is calculated based on the difference from the black level used for dark current correction, and, furthermore, the change level is multiplied by a correction coefficient and used for clamping in order to prevent erroneous correction.

In addition, there are cases where, depending on the layout of the image sensor 103, a dark signal of the pixel area has shading in the horizontal direction and vertical direction. In this case, pixel signals of the open area may also be corrected using pixel signals of OB pixels arranged at the same position in the horizontal direction or vertical direction, according to the characteristic of the shading.

In this manner, pixel signals of the OB area are read out before pixel signals of the open area are read out, and pixel signals of the OB area are also read out at the same timing as the open area, and the pixel signals are used for calculating a correction value, and thereby clamp processing can be performed appropriately.

Variation of Second Embodiment

Next, a variation of the second embodiment of the present invention will be described. In the image sensor 103 having the pixel arrangement as shown in FIG. 4B, the pixel signals of the OB area 401 (hereinafter, VOB) arranged in an upper portion (long side portion) of the open area 402 are driven as shown in FIG. 7 or 9. In addition, the pixel signals of the OB area 401 (hereinafter, HOB) arranged in a left portion (short side portion) of the open area 402 are read out at the same timing as the open area 402. A configuration may also be adopted in which dark current correction is performed using the pixel signals of VOB read out first, and the correction of change-in level during readout is performed using the pixel signals of HOB read out at the same timing as the open area 402.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-145411, filed on Aug. 1, 2018 which is hereby incorporated by reference herein in its entirety.

What is claimed is:

1. An image sensor comprising:
a pixel unit including a plurality of first pixel blocks each of which includes a plurality of first pixels shielded from light and a plurality of second pixel blocks each of which includes a plurality of second pixels that are not shielded from light;
a plurality of first readout circuits each including an analog-to-digital (A/D) converter;
a plurality of second readout circuits each including an A/D converter; and
a controller that controls first readout operations of reading out pixel signals from the plurality of first pixel blocks into the plurality of first readout circuits, and second readout operations of reading out pixel signals from the plurality of second pixel blocks into the plurality of second readout circuits,
wherein the plurality of first pixel blocks and the plurality of second pixel blocks of the pixel unit are arranged on a first substrate in matrix,
the plurality of first readout circuits and the plurality of second readout circuits are arranged on a second substrate which is stacked on the first substrate so that the plurality of first readout circuits are connected to the plurality of first pixel blocks, respectively, and the plurality of second readout circuits are connected to the plurality of first pixel blocks, respectively, and
the controller performs control so that power-saving driving is performed on the plurality of first readout circuits and the plurality of second readout circuits and, upon sequentially performing the first readout operations and the second readout operations, the power-saving driving on the first readout circuits is stopped before the power-saving driving on the second readout circuits is stopped.

2. The image sensor according to claim 1, wherein a number of first pixels included in each of the first pixel blocks is smaller than a number of second pixels included in each of the second pixel blocks.

3. The image sensor according to claim 1, wherein the controller performs control so as to end the first readout operations of pixel signals from all of the first pixels included in each of the plurality of first pixel blocks before the second readout operations start.

4. The image sensor according to claim 1, wherein the controller matches accumulation periods of charges of the plurality of first pixels and the plurality of second pixels by starting accumulation operations of charges of the plurality of first pixels and the plurality of second pixels at different times.

5. The image sensor according to claim 1, wherein the plurality of first pixel blocks are arranged in a periphery portion of the plurality of second pixel blocks.

6. The image sensor according to claim 1, wherein the controller controls the first readout operations of pixel signals from a predetermined portion of the first pixels included in each of the plurality of first pixel blocks to be performed before the second readout operations start, and controls the first readout operations of pixel signals from first pixels excluding the predetermined portion of the first pixels to be performed in parallel with the second readout operations.

7. The image sensor according to claim 1, wherein the plurality of first pixel blocks are arranged in a long side portion and a short side portion of an area made up of the plurality of second pixel blocks, and
the controller controls the first readout operations of pixel signals from all of the first pixels included in each of the first pixel blocks arranged in the long side portion to be performed before the second readout operations starts, and the controls the first readout operations of pixel signals of all of the first pixels included in each of the first pixel blocks arranged in the short side portion to be performed in parallel with the second readout operations.

8. The image sensor according to claim 1, further comprising:
a corrector that corrects a black level based on pixel signals read out from the plurality of first pixel blocks before the second readout operations start.

9. The image sensor according to claim 6, further comprising:
a corrector that corrects variation of pixel signals of the second pixel block caused by a change in a drive signal during the second readout operations based on the pixel signals of the first pixel block read out in parallel with the pixel signals of the second pixel blocks.

10. The image sensor according to claim 7, further comprising:
a corrector that corrects variation of pixel signals of the second pixel block caused by a change in a drive signal during the second readout operations based on the pixel signals of the first pixel block read out in parallel with the pixel signals of the second pixel blocks.

11. The image sensor according to claim 7, further comprising:
a corrector that corrects a black level based on the pixel signals of the first blocks arranged in the long side portion, and corrects variation of pixel signals of the second pixel block caused by a change in a drive signal during the second readout operations, based on the pixel signals of the first pixel blocks arranged in the short side portion.

12. The image sensor according to claim 1,
wherein the controller performs control so as to end the first readout operations of reading out pixel signals from at least a predetermined portion of the first pixels included in each of the plurality of first pixel blocks, before the second readout operations start.

13. An image capturing apparatus comprising:
an image sensor comprising:
a pixel unit including a plurality of first pixel blocks each of which includes a plurality of first pixels shielded from light and a plurality of second pixel blocks each of which includes a plurality of second pixels that are not shielded from light;
a plurality of first readout circuits each including an analog-to-digital (A/D) converter;
a plurality of second readout circuits each including an A/D converter; and
a controller that controls a plurality of first readout operations of pixel signals from the plurality of first pixel blocks into the plurality of first readout circuits, and second readout operations of reading out pixel signals from the plurality of second pixel blocks into the plurality of second readout circuits,
wherein the plurality of first pixel blocks and the plurality of second pixel blocks of the pixel unit are arranged on a first substrate in matrix,
the plurality of first readout circuits and the plurality of second readout circuits are arranged on a second substrate which is stacked on the first substrate so that the plurality of first readout circuits are connected to the plurality of first pixel blocks, respectively, and the plurality of second readout circuits are connected to the plurality of first pixel blocks, respectively, and
the controller performs control so that power-saving driving is performed on the plurality of first readout circuits and the plurality of second readout circuits and, upon sequentially performing the first readout operations and the second readout operations, the power-saving driving on the first readout circuits is stopped before the power-saving driving on the second readout circuits is stopped; and
a corrector that corrects a black level based on pixel signals read out from the plurality of first pixel blocks, before readout of pixel signals from the plurality of second pixel block is started.

14. A control method of an image sensor that includes a pixel unit including a plurality of first pixel blocks each of which includes a plurality of first pixels shielded from light and a plurality of second pixel blocks each of which includes a plurality of second pixels that are not shielded from light, a plurality of first readout circuits each including an analog-to-digital (A/D) converter, a plurality of second readout circuits each including an A/D converter, and a controller that controls first readout operations of reading out pixel signals from the plurality of first pixel blocks into the plurality of first readout circuits, and second readout operations of reading out pixel signals from the plurality of second pixel blocks into the plurality of second readout circuits, wherein the plurality of first pixel blocks and the plurality of second pixel blocks of the pixel unit are arranged on a first substrate in matrix, the plurality of first readout circuits and the plurality of second readout circuits are arranged on a second substrate which is stacked on the first substrate so that the plurality of first readout circuits are connected to the plurality of first pixel blocks, respectively, and the plurality of second readout circuits are connected to the plurality of first pixel blocks, respectively, the method comprising:
performing control so that power-saving driving is performed on the plurality of first readout circuits and the plurality of second readout circuits and, upon sequentially performing the first readout operations and the second readout operations, the power-saving driving on the first readout circuits is stopped before the power-saving driving on the second readout circuits is stopped.

* * * * *